United States Patent
Shi et al.

(10) Patent No.: US 9,612,541 B2
(45) Date of Patent: Apr. 4, 2017

(54) QUALIFYING PATTERNS FOR MICROLITHOGRAPHY

(71) Applicant: KLA-Tencor Corporation, Milpitas, CA (US)

(72) Inventors: Rui-fang Shi, Cupertino, CA (US); Mark Wagner, Rehovot (IL)

(73) Assignee: KLA-Tencor Corporation, Milpitas, CA (US)

( * ) Notice: Subject to any disclaimer, the term of this patent is extended or adjusted under 35 U.S.C. 154(b) by 396 days.

(21) Appl. No.: 14/461,638

(22) Filed: Aug. 18, 2014

(65) Prior Publication Data

US 2015/0054940 A1    Feb. 26, 2015

Related U.S. Application Data

(60) Provisional application No. 61/867,939, filed on Aug. 20, 2013.

(51) Int. Cl.
| | |
|---|---|
| *G03F 7/20* | (2006.01) |
| *G06T 7/00* | (2017.01) |
| *G03F 1/84* | (2012.01) |
| *G03F 1/70* | (2012.01) |

(52) U.S. Cl.
CPC ............ *G03F 7/7065* (2013.01); *G03F 1/70* (2013.01); *G03F 1/84* (2013.01); *G03F 7/705* (2013.01); *G06T 7/001* (2013.01); *G06T 2207/10056* (2013.01); *G06T 2207/30148* (2013.01)

(58) Field of Classification Search
CPC ... G03F 1/70; G03F 1/84; G03F 7/705; G03F 7/7065; G06T 7/001; G06T 2207/10056; G06T 2207/30148
See application file for complete search history.

(56) References Cited

U.S. PATENT DOCUMENTS

| | | |
|---|---|---|
| 6,902,855 B2 | 6/2005 | Peterson et al. |
| 7,418,124 B2 | 8/2008 | Peterson |
| 7,646,906 B2 | 1/2010 | Saidin et al. |

(Continued)

FOREIGN PATENT DOCUMENTS

| | | |
|---|---|---|
| JP | 2004157518 A | 6/2004 |
| JP | 2005538425 A | 12/2005 |
| WO | 2013142079 A1 | 9/2013 |

OTHER PUBLICATIONS

"International Application Serial No. PCT/US2014/051891, Search Report and Written Opinion mailed Nov. 27, 2014", 9 pgs.

*Primary Examiner* — Edward Park
(74) *Attorney, Agent, or Firm* — Kwan & Olynick LLP

(57) ABSTRACT

Disclosed are methods and apparatus for qualifying a photolithographic reticle. A reticle inspection tool is used to acquire at least two images at different imaging configurations from each pattern area of the reticle. A reticle pattern is reconstructed based on each at least two images from each pattern area of the reticle. For each reconstructed reticle pattern, a lithographic process with two or more different process conditions is modeled on such reconstructed reticle pattern to generate two or more corresponding modeled test wafer patterns. Each two or more modelled test wafer patterns is analyzed to identify hot spot patterns of the reticle patterns that are susceptible to the different process conditions altering wafer patterns formed with such hot spot patterns.

25 Claims, 5 Drawing Sheets

(56) References Cited

U.S. PATENT DOCUMENTS

| | | | | |
|---|---|---|---|---|
| 7,873,204 B2* | 1/2011 | Wihl | ............... | G03F 1/84 |
| | | | | 382/144 |
| 7,932,004 B1 | 4/2011 | Xiong et al. | | |
| 7,995,832 B2 | 8/2011 | Xiong et al. | | |
| 2008/0130982 A1* | 6/2008 | Kitamura | ............... | G06K 9/00 |
| | | | | 382/144 |
| 2011/0194752 A1* | 8/2011 | Pang | ............... | G03F 1/84 |
| | | | | 382/149 |
| 2011/0222739 A1* | 9/2011 | Zhou | ............... | G03F 7/705 |
| | | | | 382/112 |
| 2011/0299759 A1 | 12/2011 | Shi et al. | | |
| 2013/0236083 A1 | 9/2013 | Wang et al. | | |
| 2015/0043803 A1* | 2/2015 | Jeong | ............... | G06T 7/001 |
| | | | | 382/149 |

\* cited by examiner

QUALIFYING PATTERNS FOR MICROLITHOGRAPHY

CROSS-REFERENCE TO RELATED APPLICATIONS

This application claims priority under 35 U.S.C. §119 of prior U.S. Provisional Application No. 61/867,939, filed 20 Aug. 2013, entitled "Qualifying Patterns for Microlithographic Fabrication Prior to High Volume Manufacturing" by Rui-Fang Shi et al., which application is herein incorporated by reference in its entirety for all purposes.

TECHNICAL FIELD OF THE INVENTION

The invention generally relates to the field of reticle inspection. More particularly the present invention relates to pattern qualification.

BACKGROUND

Generally, the industry of semiconductor manufacturing involves highly complex techniques for fabricating integrating circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device is fault free prior to shipment to the end users or customers.

An integrated circuit is typically fabricated from a plurality of reticles. Initially, circuit designers provide circuit pattern data, which describes a particular integrated circuit (IC) design, to a reticle production system, or reticle writer. The circuit pattern data is typically in the form of a representational layout of the physical layers of the fabricated IC device. The representational layout includes a representational layer for each physical layer of the IC device (e.g., gate oxide, polysilicon, metallization, etc.), wherein each representational layer is composed of a plurality of polygons that define a layer's patterning of the particular IC device. The reticle writer uses the circuit pattern data to write (e.g., typically, an electron beam writer or laser scanner is used to expose a reticle pattern) a plurality of reticles that will later be used to fabricate the particular IC design.

A reticle or photomask is an optical element containing at least transparent and opaque regions, and sometimes semi-transparent and phase shifting regions, which together define the pattern of coplanar features in an electronic device such as an integrated circuit. Reticles are used during photolithography to define specified regions of a semiconductor wafer for etching, ion implantation, or other fabrication processes.

After fabrication of each reticle or group of reticles, each new reticle typically is qualified for use in wafer fabrication. For example, reticle patterns need to be free of printable defects. Thus, there is a continuing need for improved reticle inspection and qualification techniques.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of qualifying a photolithographic reticle is disclosed. A reticle inspection tool is used to acquire at least two images at different imaging configurations from each pattern area of the reticle. A reticle pattern is reconstructed based on each at least two images from each pattern area of the reticle. For each reconstructed reticle pattern, a lithographic process with two or more different wafer process conditions is modeled on such reconstructed reticle pattern to generate two or more corresponding modeled test wafer patterns. Each two or more modelled test wafer patterns are analyzed to identify hot spot patterns of the reticle patterns that are susceptible to the different process conditions altering wafer patterns formed with such hot spot patterns.

In a specific example, reflected and transmitted images are acquired with a high resolution microscope. In another example, two or more reflected images with different pupil shapes and/or different focal conditions are acquired. This example is especially applicable to EUV (extreme ultra violet) photomasks. In yet another aspect, at least two images at different imaging conditions include information from which amplitude and phase of the corresponding reticle's pattern area may be determined, for example, through mathematically iterative processes. In a specific implementation, the two or more different process conditions include two or more different exposure and focus settings or a plurality of exposure and focus settings from a focus exposure matrix (FEM). In a further aspect, a photoresist material is modelled. In yet a further aspect, an etching or chemical mechanical planarization (CMP) process is modelled.

In one implementation, hot spot patterns are identified prior to commencement of high volume wafer fabrication with such reticle or prior to any wafer fabrication with such reticle. In one embodiment, the method includes (i) simulating a plurality of reference reticle patterns based on a plurality of post-OPC (optical proximity correction) design patterns; and (ii) performing the modelling operation on each reference reticle pattern so as to generate two or more corresponding modeled reference wafer patterns. In this implementation, analyzing includes comparing each modelled test wafer pattern to its corresponding reference wafer pattern and identifying a hot spot pattern for such modelled test pattern when a difference resulting from such comparison exceeds a predetermined threshold. In a further aspect, a plurality of initial hot spot locations are identified for the reference and test reticle patterns and modelled test and reference wafer patterns are generated that correspond to only initial hot spot locations.

In one implementation, each hot spot pattern is identified when its corresponding two or more modelled test wafer patterns vary by a predetermined amount for the different two or more process conditions. In an alternative embodiment, analyzing each two or more modelled test wafer patterns includes analyzing a plurality of corresponding post-OPC design patterns to separate effects of the two or more different process conditions on a design used to fabricate the reticle from effects of the two or more different process conditions on the reticle. In another aspect, the method includes inspecting wafer patterns that are fabricated with such reticle corresponding to the identified hot spot patterns with a lower threshold than wafer patterns that do not correspond to the identified hot spot patterns. In a further application, a design pattern corresponding to an identified hot spot pattern is modified and a new reticle is fabricated based on such modified design pattern.

In certain embodiments, the invention pertains to an inspection system for qualifying a photolithographic reticle. The system includes a light source for generating an incident beam and an illumination optics module for directing the incident beam onto a sample. The system also has a collection optics module for directing two or more output beams, at different imaging configuration in response to the incident beam, from each pattern area of the reticle to at least one sensor. At least one sensor is configured for detecting the two or more output beams and generating two or more images or signals for the two or more output beams. The system further includes a controller that is configured to perform at least some of the above described operations. In other embodiments, the invention pertains to computer readable media having instructions stored thereon for performing at least some of the above described operations.

These and other aspects of the invention are described further below with reference to the figures.

DETAILED DESCRIPTION OF EXAMPLE EMBODIMENTS

Figure 1:
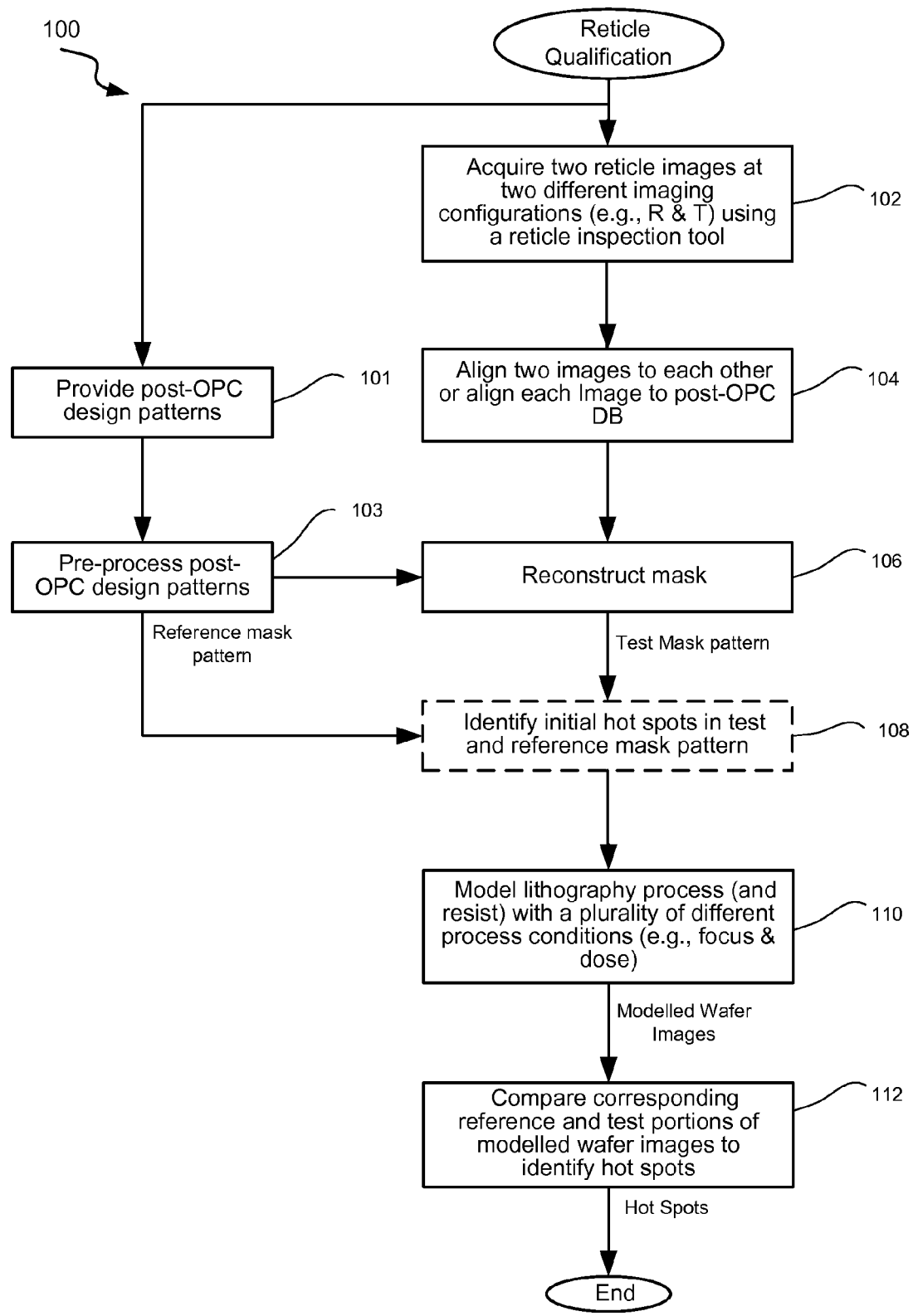
FIG. 1 is a flow chart illustrating a reticle qualification process for identifying hot spots in accordance with one embodiment of the present invention.

In the following description, numerous specific details are set forth in order to provide a thorough understanding of the present invention. The present invention may be practiced without some or all of these specific details. In other instances, well known process operations or apparatus components have not been described in detail to not unnecessarily obscure the present invention. While the invention will be described in conjunction with the specific embodiments, it will be understood that it is not intended to limit the invention to the embodiments.

The terms "reticle" generally includes a transparent substrate, such as glass, borosilicate glass, quartz, or fused silica having a layer of opaque material formed thereon. The opaque (or substantially opaque) material may include any suitable material that completely or partially blocks photolithographic light (e.g., deep UV). Example materials include chrome, molybdenum silicide (MoSi), tantalum silicide, tungsten silicide, opaque MoSi on glass (OMOG), etc. A polysilicon film may also be added between the opaque layer and transparent substrate to improve adhesion. A low reflective film, such as molybdenum oxide ($MoO_2$), tungsten oxide ($WO_2$), titanium oxide ($TiO_2$), or chromium oxide ($CrO_2$) may be formed over the opaque material.

The term reticle refers to different types of reticles including, but not limited to, a clear-field reticle, a dark-field reticle, a binary reticle, a phase-shift mask (PSM), an alternating PSM, an attenuated or halftone PSM, a ternary attenuated PSM, a chromeless phase lithography PSM, and chromeless phase lithography (CPL). A clear-field reticle has field or background areas that are transparent, and a dark-field reticle has field or background areas that are opaque. A binary reticle is a reticle having patterned areas that are either transparent or opaque. For example, a photomask made from a transparent fused silica blank with a pattern defined by a chrome metal adsorbing film can be used. Binary reticles are different from phase-shift masks (PSM), one type of which may include films that only partially transmit light, and these reticles may be commonly referred to as halftone or embedded phase-shift masks (EPSMs), such as ArF and KrF masks. If a phase-shifting material is placed on alternating clear spaces of a reticle, the reticle is referred to as an alternating PSM, an ALT PSM, or a Levenson PSM. One type of phase-shifting material that is applied to arbitrary layout patterns is referred to as an attenuated or halftone PSM, which may be fabricated by replacing the opaque material with a partially transmissive or "halftone" film. A ternary attenuated PSM is an attenuated PSM that includes completely opaque features as well.

As densities and complexities of integrated circuits (ICs) continue to increase, inspecting photolithographic mask patterns become progressively more challenging. Every new generation of ICs has denser and more complex patterns that currently reach and exceed optical limitations of lithographic systems. To overcome these optical limitations, various Resolution Enhancement Techniques (RET), such as Optical Proximity Correction (OPC), have been introduced. For example, OPC helps to overcome some diffraction limitations by modifying photomask patterns such that the resulting printed patterns correspond to the original desired patterns. Such modifications can include perturbations to sizes and edges of main IC features, i.e., printable features. Other modifications involve additions of serifs to pattern corners and/or providing nearby sub-resolution assist features (SRAFs), which are not expected to result in printed features and, therefore, are referred to as non-printable features. These non-printable features are expected to cancel pattern perturbations that would otherwise have occurred during the printing process. However, OPC makes mask patterns even more complex and usually very dissimilar to resulting wafer images. Furthermore, OPC defects often do not translate into printable defects. The increased complexity of the photomask pattern and fact that not all pattern elements are expected to directly affect the printed pattern makes the task of inspecting the photomask for meaningful pattern defects much more difficult.

One measure of a defect's importance is its MEEF or Mask Error Enhancement Factor. This factor relates the size of the defect in the mask plane to the magnitude of the impact it will have on the printed image. High MEEF defects have high impact on the printed pattern; low MEEF defects have little or no impact on the printed pattern. An undersized main pattern feature in a dense fine-line portion of a pattern is an example of a defect with high MEEF where a small mask plane sizing error could cause a complete collapse of the printed pattern. An isolated small pinhole is an example of a defect with low MEEF where the defect itself is too small to print and is distant enough from the nearest main pattern edge so as not to affect how that edge is printed. As these examples show the MEEF of a defect is a somewhat complicated function of the defect type and the pattern context in which the defect is located.

In addition to higher MEEF mask defects causing more significant wafer defects, certain design patterns and corresponding mask patterns may be more robust than other design and mask patterns to process changes. When the fabrication process begins to drift from optimal process conditions, certain mask patterns may result in more significant wafer pattern perturbations and defects.

Certain embodiments of the present invention provide mechanisms for identifying areas of the mask pattern that are more affected by process variation, herein referred to as "hot spots", at which a mask pattern may not print well on the wafer. There are many different definitions of hot spots. One definition is the pattern prints well on wafer at the nominal focus-exposure conditions but the pattern will not print well at the edge of the unavoidable process window variation. A typical OPC verification engine can predict some of these hot spots. However, the OPC verification engine's deficiency is that it cannot predict hot spots due to the mask making process variation, especially in the high MEEF areas. Alternatively, the OPC verification engine may produce too many hot spot candidates for the user to do anything about them.

One embodiment of the present invention is to re-rank the hot spots taking the actual physical mask into consideration. FIG. 1 is a flow chart illustrating a reticle qualification process 100 for identifying hot spots in accordance with one embodiment of the present invention. The following hot spot pattern identification process for a particular reticle may be performed prior to fabrication of any wafers with such reticle or prior to commencement of high volume wafer fabrication. Initially, at least two reticle images are acquired using a reticle inspection tool in operation 102. The different imaging configurations are selected to provide images from which the amplitude of the mask patterns may be calculated. For example, the imaging configurations may include high resolution images, such as transmitted and reflected images (e.g., for ArF masks). In another embodiment, two reflected images with different pupil shapes and/or different focal conditions may be obtained (e.g., for EUV masks).

Acquisition with different imaging configurations might be simultaneous or sequential. In certain imaging configurations, the images that are acquired images from which both the amplitude and phase information of the mask patterns, which lead to more accurate subsequent predictions, may be deduced. The acquired images do not have to be at the field planes. The two or more images can be acquired at the pupil planes. One example is the well-known Gerchberg-Saxton algorithms in which a combination of field plane images and pupil plane diffraction orders can be utilized to solve both the amplitude and phase of the object.

The two or more images may then be aligned with each other or each image may be aligned to the post-OPC database in operation 104. This alignment may involve matching optical properties of the inspection system(s) for multiple images. For example, in the case of transmitted and reflected images, some adjustment of the images can be made to compensate for differences in optical paths of the two respective signals. Alignment adjustments may depend on specific geometries of an inspection system that is used. Alignment with the post-OPC database can be done typically by deducing a set of key system parameters first, modeling the database into a theoretical optical image, and then aligning the experimentally measured optical image with the theoretical optical image via spatial-domain or frequency-domain methods.

Once aligned, the mask pattern may be reconstructed based on the two or more aligned images in operation 106. The reconstructed mask pattern is generally recovered so as to be free of the characteristics of the imaging system used to acquire the mask images. In one specific implementation, the spot image (also referred to as a band limited mask image) is first recovered from the two or more images. In the following description utilizes reflected and transmitted images although other types of image configurations may be utilized for the two or more reticle images.

For instance, the process for constructing a spot image may include substantially eliminating optical noise from the transmitted and reflected images to obtain a resulting spot image. In general, high frequency effects are substantially reduced or eliminated. For example, rings that are formed around particular reticle patterns due to optical effects of the inspection system are removed in the spot image. The spot image can be formed with a reduction in the amount of overshoot and undershoot. The reflected and transmitted images can be combined with selected coefficients in a linear combination so that the high frequencies terms cancel each other out. As a result, the spot image is a band-limited low-passed version of the mask pattern image.

In one approach, partially coherent optical imaging can be modeled as a sum of two or more coherent systems, which is further explained in more detail in U.S. Pat. No. 7,873,204 by Wihl et al, which is incorporated herein by reference for purposes of describing operation 206. In this example implementation, the Hopkins equations for partially coherent imaging can be used to form a Transmission-Cross-Coefficient (TCC) matrix. This matrix can be then decomposed into corresponding Eigen vectors, which act as kernels of coherent systems. The Eigen value weighted sum of the intensity contributions from each of these coherent systems yields the image intensity, which can be used to represent the intensity of the transmitted signal. In certain embodiments, reflected and transmitted intensities of the test images can be represented with only linear terms that are referred to as band limited mask amplitude functions. An example of this function is presented in Equation 1.

$$\frac{\|a_R\|^2 (I_T(x,y) - \|c_T\|^2) - \|a_T\|^2 (I_R(x,y) - \|c_R\|^2)}{2\|a_R\|^2 \mathrm{Re}(a_T c_T^*) - 2\|a_T\|^2 \mathrm{Re}(a_R c_R^*)} = \qquad [\text{Equation 1}]$$

$$\sum \lambda_i D_i [P(x,y) \oplus E_i(x,y)] =$$

$$P(x,y) \oplus \sum_{i=0}^{N} \lambda_i D_i E_i(x,y) = M(x,y)$$

where $a_R$ is the complex reflected amplitude of the difference between the mask foreground tone and the background tone; $I_T(x,y)$ describes the transmitted intensity image of a mask using the inspection system; $C_T$ is the complex transmitted amplitude of the background tone of the mask (e.g., in a quartz and chrome binary mask $C_T$ can describe properties of the chromium pattern); $a_T$ is the complex transmitted amplitude of the difference between the mask foreground tone and the background tone (e.g., using the same mask as above $a_T$ can describe the optical properties of the difference between the quartz and the chromium; $c_T$ and $a_T$, of course, vary depending on the properties of the material layers described); $I_R(x,y)$ describes the reflected intensity image of a mask using the inspection system; $C_R$ is the complex reflected amplitude of the background tone of the mask and $a_R$ is the complex reflected amplitude of the difference between the mask foreground tone and the background tone; Re (x) represents the real component of x; P(x,y) defines the mask pattern of the photomask being inspected; $E_i$ and $\lambda_i$ refer, respectively, to the Eigen Vectors and Eigen Values of associated elements of a transmission cross-coefficient (TCC) imaging matrix associated with the inspection tool; $D_i$ is the DC gain of $E_i$.

The band limited mask pattern M (x,y) is defined by the mask pattern P (x,y) convolved with a function: $\Sigma_{i=0}^{N} \lambda_i D_i E_i$ (x, y), which is referred to as a "recovery kernel". Therefore, the band limited mask pattern is a modified version of the mask pattern function P (x,y).

Although combining the reflected and transmitted images results in some high frequency portions of the image, which are due to optical effects, to be cancelled, the spot image construction is still an approximation of the "true" mask (e.g., without aberrations) because some aberrations remain in the spot image. In a further embodiment, the constructed spot image can be processed to compensate for certain aberrations. For example, a method can be used to calibrate static aberrations offline and then filter aberration effects from the spot image. In general, a variety of patterns may be fabricated on a calibration mask and then imaged. The aberration terms in the calibration image can then be extracted for the different patterns. The extracted aberration terms can then be subtracted from images of similar patterns of the spot image so that such aberration terms are removed from the spot image.

After the spot image is constructed, a restoration inversion process may be performed to obtain a restored mask pattern. That is, a more "true" or binary-like mask pattern is derived from the spot image in an inversion process. For example, patterns in the spot image that may be blurred by the optics are sharpened to form a mask pattern.

Post-OPC design patterns may also be obtained in operation 101. The post-OPC design patterns may be pre-processed in operation 103 to generate reference or ideal mask patterns. That is, the post-OPC design patterns may be processed so as to simulate the mask making process and simulate changes to the design patterns as they are used to make a mask. For instance, design pattern corners are rounded in the simulated reference mask pattern, as compared to the design pattern.

In the case where the two images are both reflected (applicable to EUV masks) or transmitted (low NA imaging condition to mimic the stepper illumination and imaging conditions), the recovered mask (aka mask near field m) which carries the phase and amplitude information can be determined by the following equation $$m = \operatorname{argmin} \sum_{\alpha} c_\alpha \sum_{x,y} \left[ I_\alpha - \sum_i \lambda_i^{(\alpha)} |m \otimes \psi_i^{(\alpha)}|^2 \right]^2$$

In the above equation, $I_\alpha$ is the measured optical image for image plane $\alpha$, $\psi_i^{(\alpha)}$ is a set of eigenvectors describing the optical imaging system, $\lambda_i^{(\alpha)}$ is a set of corresponding eigenvalues for the optical imaging system, and $c_\alpha$ is a non-negative weighting factor between 0 and 1. The above equation can be solved iteratively through for example methods such as conjugate gradient. Care can be taken to ensure minimizing the mathematical ill-conditioning risk.

An initial set of hot spots may be optionally identified in both the reference and test mask pattern in operation 108. For instance, a designer may provide a list of hot spot coordinates. The following process will result in a ranking or filtering of these initial hot spots into a final set of hot spots. Otherwise, the entire mask may be processed to locate hot spots as described further below.

The lithography process may then be modeled with a plurality of different process conditions in operation 110. That is, the lithography process is modeled with respect to both the test and reference mask patterns under two or more process conditions. Each process condition generally corresponds to a set of wafer manufacturing process parameters that characterize, or partially characterize the wafer process. For example, a particular setting of focus and exposure can be defined as a process condition. At least two process conditions are modeled. A typical set of process conditions may include entries of a "focus exposure matrix" (FEM). For each process condition, the effect of the process condition is simulated on the reconstructed mask image. These simulations result in a set of simulated wafer or resist pattern images, or models, formed by the reconstructed mask or mask near field. The model may include just the effect of the photolithography scanner, and/or it may also include the effect of resist, etch, CMP or any other wafer processes. One example process simulation tool is Prolith available from KLA-Tencor Corp. of Milpitas, Calif.

Corresponding test and reference portions of the modeled images, which are simulated under different process conditions, may be compared so as to identify hot spots in operation 112. A hot spot may be defined when a difference between any pair of test and reference image portions for any process condition is above a predefined threshold, such as a 8 or 10% change for a critical parameter. Additionally or alternatively, hot spot patterns may be identified merely when a test mask pattern changes by a predefined amount regardless of how such change compares to the reference wafer pattern that is derived from the post-OPC data. In other words, a significant change in the physical mask pattern under different process conditions may indicate a problem with the intended design pattern. Differences between the corresponding modeled image portions represent differences in the effect of the process conditions on the designed pattern and the manufactured mask. Differences associated with a particular design pattern are commonly referred to as "design hot spots", or just "hot spots", and represent weak points in the design with respect to the particular process conditions that have been examined, maybe also, with respect to the manufactured mask. Examples of the kinds of differences that might be found between modeled images for different process conditions are CD (critical dimension) or EPE (edge placement error).

Any suitable mechanism may also be used to store and/or display a hot spot map in any suitable form. For example, a hot spot map can be represented textually in the form of a list of hot spot locations. One or more pattern differences for process conditions may be listed alongside corresponding hot spot coordinates. Varying amounts of wafer pattern change can also be represented by a metric, such as the standard deviation or variance of the pattern difference values. Alternatively or additionally, a hot spot map may be represented visually so that different pattern variation values or ranges are shown in different visual ways, such as differently colored reticle areas, different bar graph heights, different graph values, or 3-dimensional representations, etc.

Figure 2:
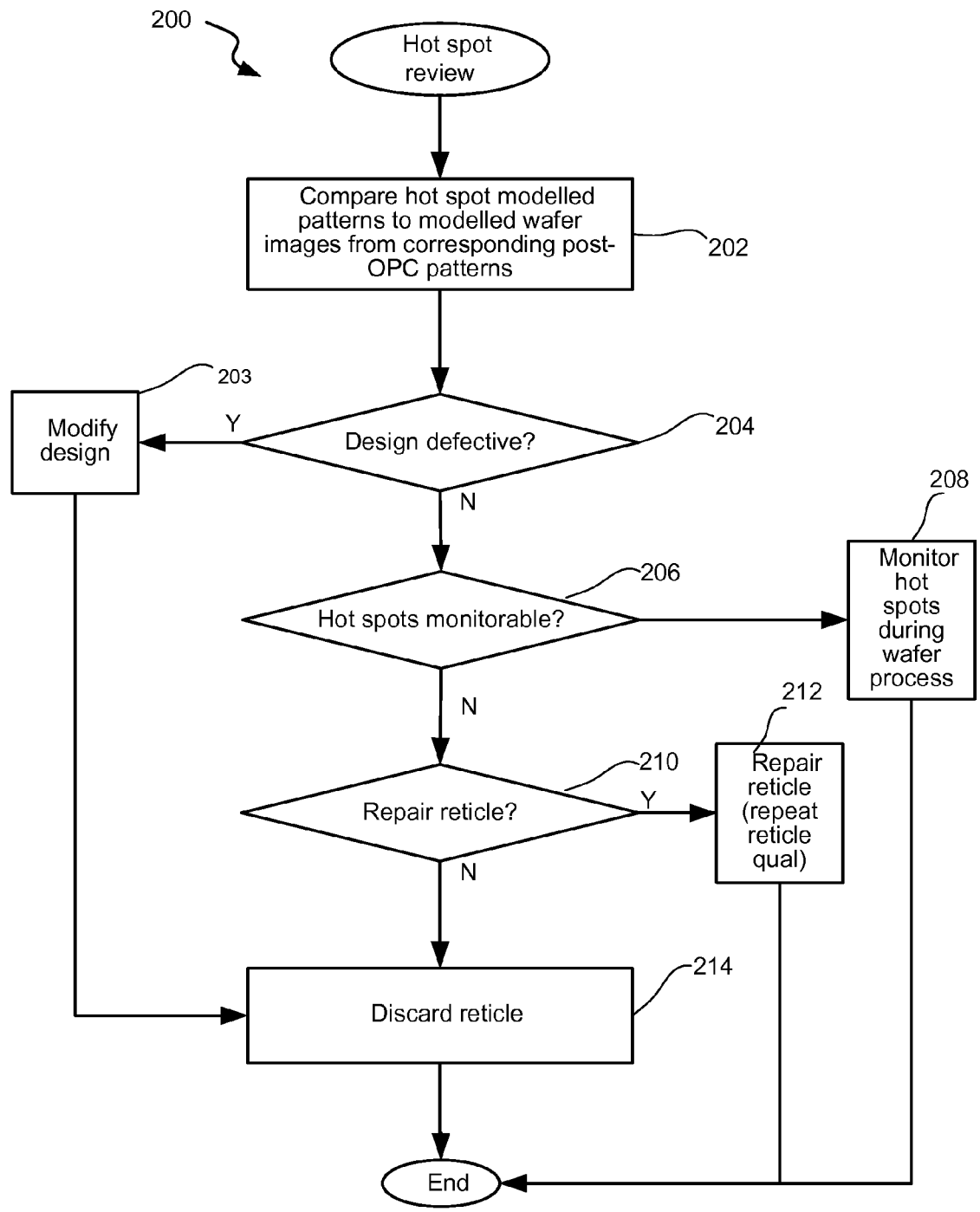
FIG. 2 is a flow chart representing a hot spot review process in accordance with one embodiment of the present invention.

FIG. 2 is a flow chart representing a hot spot review process 200 in accordance with one embodiment of the present invention. The post-OPC database represents the pattern that is intended by the designer to be printed on the wafer. Optionally, the post-OPC database can be used with the modeled images to improve hot spot detection. For example, a model of the post-OPC database takes into account design effects only, and so can be used to separate the effect of the wafer process on the design and the effect of the wafer process on the manufactured mask. In the illustrated example, hot spot modelled patterns may be compared to modelled wafer images from corresponding post-OPC patterns in operation 202. For instance, when a set of hot spot modelled wafer patterns for different process changes match corresponding modelled post-OPC wafer patterns for the same process changes, the changes in wafer pattern (or resist pattern) due to process change can be determined to originate from the design pattern, rather than from a defect in the mask pattern. However, if the changes on wafer due to process variations from the post-OPC database are different from those on wafer due to the same process variations from the recovered mask (or mask near field), then these hot spots are considered originating from a hot spot from the actual mask.

It may then be determined whether the design is defective in operation 204. In one embodiment, it is determined whether the design pattern results in unacceptable wafer pattern variation under a specified range of process conditions (or process window). If the design is determined to be defective, the design may be modified in operation 203.

If the design is not deemed defective, it may then be determined whether the hot spots can be monitored in operation 206. If the hot spots are to be monitored, the hot spots can then be monitored during the wafer process in operation 208, for instance, as described further below. For instance, the hot spots patterns may be monitored during wafer fabrication to determine whether the process has drifted out of specification and has caused the corresponding wafer pattern to have critical parameters that change to unacceptable values. One implementation may involve setting a relatively high MEEF level for inspection of the corresponding hot spot's reticle and/or wafer pattern. As conditions get further away from nominal process conditions, CD or EPE can become large and endanger the integrity of the wafer manufacturing process.

It may also be determined whether the reticle is to be repaired in operation 210. The anticipated hot spot wafer pattern variations may be determined to be out of specification for the process window that is expected to be used during the lithography process. In certain cases, the reticle may contain a defect that is repaired in operation 212. The reticle may then be requalified. Otherwise, the reticle may be discarded if it is not repairable. A new reticle may then be manufactured and requalified.

Figure 3:
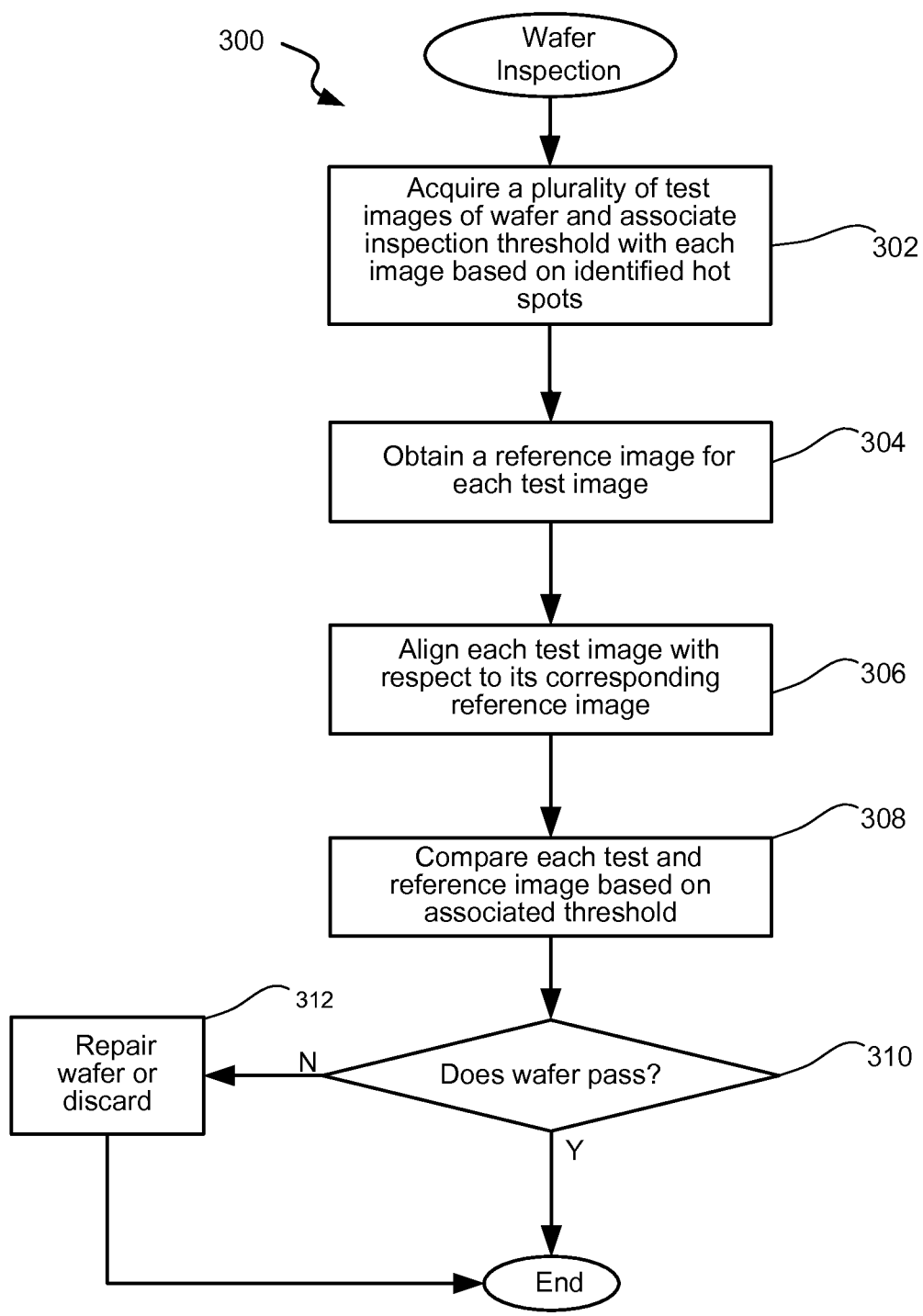
FIG. 3 is a flow chart illustrating a wafer inspection process in accordance with one embodiment of the present invention.

FIG. 3 is a flow chart illustrating a wafer inspection process 300 in accordance with one embodiment of the present invention. After the hot spot areas of a reticle are identified, such reticle can be used in one or more photolithography processes to fabricate one or more wafers. Initially, a plurality of test images of a wafer may be acquired and inspection thresholds may be associated with each image based on the identified hot spots in operation 302. For example, areas defined as hot spots may be assigned one detection threshold, while non-hot spot areas may be assigned a higher threshold (for defect detection). This differentiation can be used to optimize inspection resources.

A reference image may be obtained for each test image in operation 304. For example, another image of a die area on the wafer is obtained for a die-to-die type inspection. In a die-to-database inspection, a reference image is generated based on the design database. For example, the inspection optics are modeled and applied to the design patterns to obtain a reference image. Each test image may be aligned with respect to its corresponding reference image in operation 306.

In operation 308, each test image is compared to its corresponding reference image based on the associated threshold. For example, test and reference images may be divided into multiple areas identified by the presence or absence of hot spots. Each set of areas containing a test image area and a corresponding reference image area may be inspected individually. MEEF, associated threshold, a geometrical map, and other information specific for each area may be used in this operation.

It may then be determined based on the comparison results whether the wafer passes inspection in operation 310. If the wafer passes, the inspection process may end, and the wafer may be processed further. If the wafer does not pass, the wafer can either be repaired or discarded in operation 312 and inspection ends.

Certain techniques of the present invention provide mask pattern qualification and early detection of weak patterns or hot spots on the physical mask before beginning wafer manufacturing. Design, reticle manufacturing effects, and wafer manufacturing effects can be separated. Additionally, a full range of wafer process effects including many settings of focus and exposure, and the effect of wafer resist, etch, CMP, and any other wafer processes, can be considered. More robust pattern qualification can also be carried out on the wafer based on hot spot identification. Since mask patterns are generally 4× larger than wafer patterns, more exact locations of patterns with respect to the design database can be determined. The above techniques can also be extended to any suitable type of masks, such as pattern qualification to EUV masks.

An alternative approach, that may avoid the mask reconstruction step, is to design imaging configurations that already capture some wafer process effect. Usually, these imaging configurations are called "aerial imaging." Several aerial imaging techniques are described further in U.S. Pat. No. 7,418,124, issued 26 Aug. 2008, by Ingrid Peterson et al., which patent is incorporated herein by reference in its entirety for all purposes.

Figure 4:
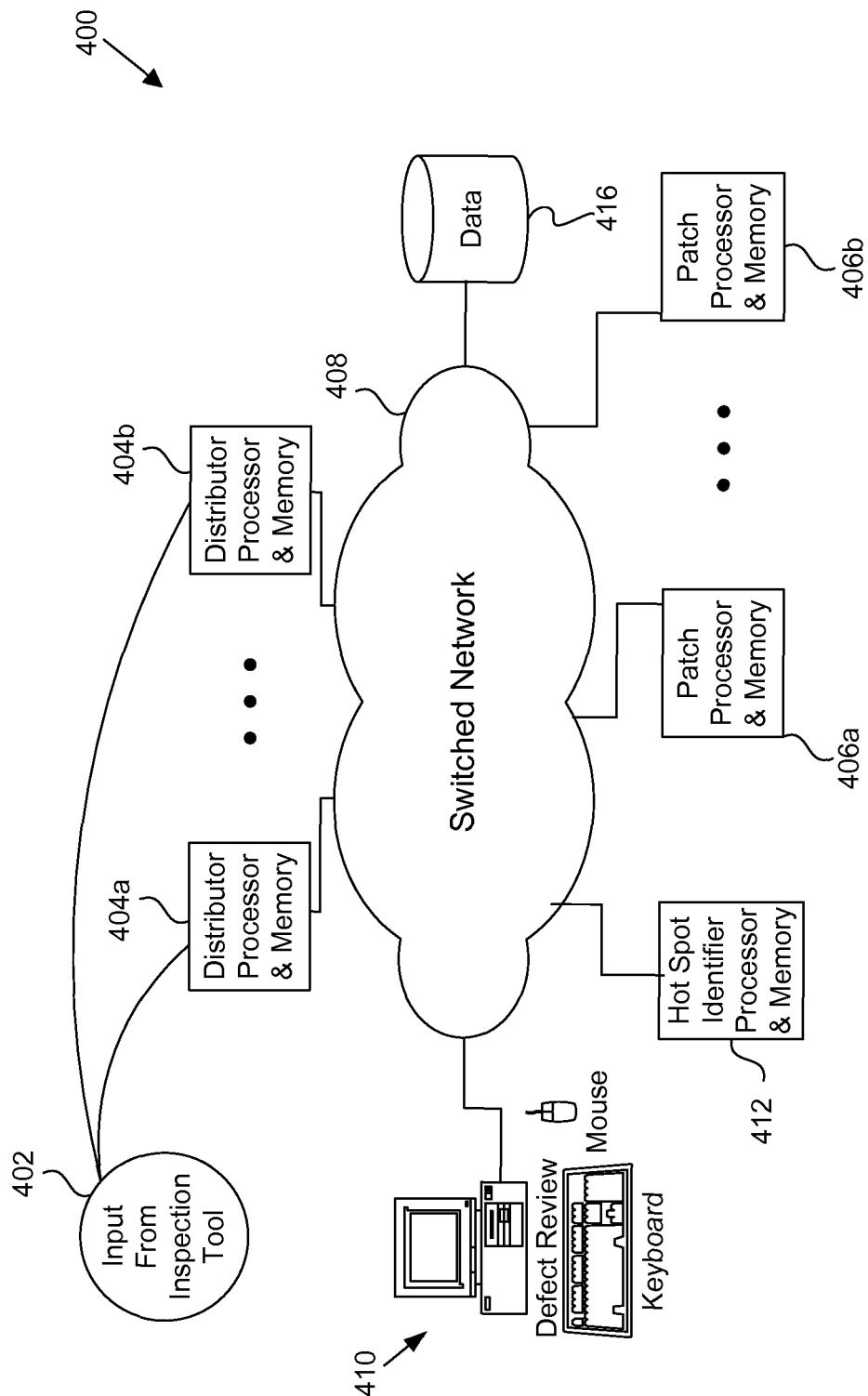
FIG. 4 is a diagrammatic representation of an example inspection system in which techniques of the present invention may be implemented.

Techniques of the present invention may be implemented in any suitable combination of hardware and/or software. FIG. 4 is a diagrammatic representation of an example inspection system 400 in which techniques of the present invention may be implemented. The inspection system 400 may receive input 402 from a high NA inspection tool or a low NA inspector mimicking a scanner (not shown). The inspection system may also include a data distribution system (e.g., 404a and 404b) for distributing the received input 402, an intensity signal (or patch) processing system (e.g., patch processors and memory 406a and 406b) for processing specific portions/patches of received input 402, a hot spot identifier system (e.g., 412) for identifying hot spots, a network (e.g., switched network 408) for allowing communication between the inspection system components, an optional mass storage device 416, and one or more inspection control and/or review stations (e.g., 410) for reviewing the identified hot spots, inspection results, etc. Each processor of the inspection system 400 typically may include one or more microprocessor integrated circuits and may also contain interface and/or memory integrated circuits and may additionally be coupled to one or more shared and/or global memory devices.

The inspector or data acquisition system (not shown) for generating input data 402 may take the form of any suitable instrument (e.g., as described further herein) for obtaining intensity signals or images of a reticle. For example, the low NA inspector may construct an optical image or generate intensity values of a portion of the reticle based on a portion of detected light that is reflected, transmitted, or otherwise directed to one or more light sensors. The low NA inspector may then output the intensity values or image may be output from the low NA inspector.

The low NA inspection tool may be operable to detect and collect reflected and/or transmitted light as an incident optical beam scans across each patch of a reticle. As noted above, the incident optical beam may scan across reticle swaths that each comprises a plurality of patches. Light is collected in response to this incident beam from a plurality of points or subareas of each patch.

The low NA inspection tool may be generally operable to convert such detected light into detected signals corresponding to intensity values. The detected signals may take the form of an electromagnetic waveform having amplitude values that correspond to different intensity values at different locations of the reticle. The detected signals may also take the form of a simple list of intensity values and associated reticle point coordinates. The detected signals may also take the form of an image having different intensity values corresponding to different positions or scan points on the reticle. Two or more images of the reticle may be generated after all the positions of the reticle are scanned and converted into detected signals, or portions of a two or more images may be generated as each reticle portion is scanned with the final two or more images for the reticle being complete after the entire reticle is scanned.

The detected signals may also take the form of aerial images. That is, an aerial imaging technique may be used to simulate the optical effects of the photolithography system so as to produce an aerial image of the photoresist pattern that is exposed on the wafer. In general, the optics of the photolithography tool are emulated so as to produce an aerial image based on the detected signals from the reticle. The aerial image corresponds to the pattern produced from the light passed through the photolithography optics and reticle onto the photoresist layer of a wafer. Additionally, the photoresist exposure process for the particular type of photoresist material may also be emulated.

The incident light or detected light may be passed through any suitable spatial aperture to produce any incident or detected light profile at any suitable incident angles. By way of examples, programmable illumination or detection apertures may be utilized to produce a particular beam profile, such as dipole, quadrapole, quasar, annulus, etc. In a specific example, Source Mask Optimization (SMO) or any pixelated illumination technique may be implemented.

Intensity or image data 402 can be received by data distribution system via network 408. The data distribution system may be associated with one or more memory devices, such as RAM buffers, for holding at least a portion of the received data 402. Preferably, the total memory is large enough to hold an entire swatch of data. For example, one gigabyte of memory works well for a swatch that is 1 million by 1000 pixels or points.

The data distribution system (e.g., 404a and 404b) may also control distribution of portions of the received input data 402 to the processors (e.g. 406a and 406b). For example, data distribution system may route data for a first patch to a first patch processor 406a, and may route data for a second patch to patch processor 406b. Multiple sets of data for multiple patches may also be routed to each patch processor.

The patch processors may receive intensity values or an image that corresponds to at least a portion or patch of the reticle. The patch processors may each also be coupled to or integrated with one or more memory devices (not shown), such as DRAM devices that provide local memory functions, such as holding the received data portion. Preferably, the memory is large enough to hold data that corresponds to a patch of the reticle. For example, eight megabytes of memory works well for intensity values or an image corresponding to a patch that is 512 by 1024 pixels. Alternatively, the patch processors may share memory.

Each set of input data 402 may correspond to a swath of the reticle. One or more sets of data may be stored in memory of the data distribution system. This memory may be controlled by one or more processors within the data distribution system, and the memory may be divided into a plurality of partitions. For example, the data distribution system may receive data corresponding to a portion of a swath into a first memory partition (not shown), and the data distribution system may receive another data corresponding to another swath into a second memory partition (not shown). Preferably, each of the memory partitions of the data distribution system only holds the portions of the data that are to be routed to a processor associated with such memory partition. For example, the first memory partition of the data distribution system may hold and route first data to patch processor 406a, and the second memory partition may hold and route second data to patch processor 406b.

The data distribution system may define and distribute each set of data of the data based on any suitable parameters of the data. For example, the data may be defined and distributed based on the corresponding position of the patch on the reticle. In one embodiment, each swath is associated with a range of column positions that correspond to horizontal positions of pixels within the swath. For example, columns 0 through 256 of the swath may correspond to a first patch, and the pixels within these columns will comprise the first image or set of intensity values, which is routed to one or more patch processors. Likewise, columns 257 through 512 of the swath may correspond to a second patch, and the pixels in these columns will comprise the second image or set of intensity values, which is routed to different patch processor(s).

Figure 5A:
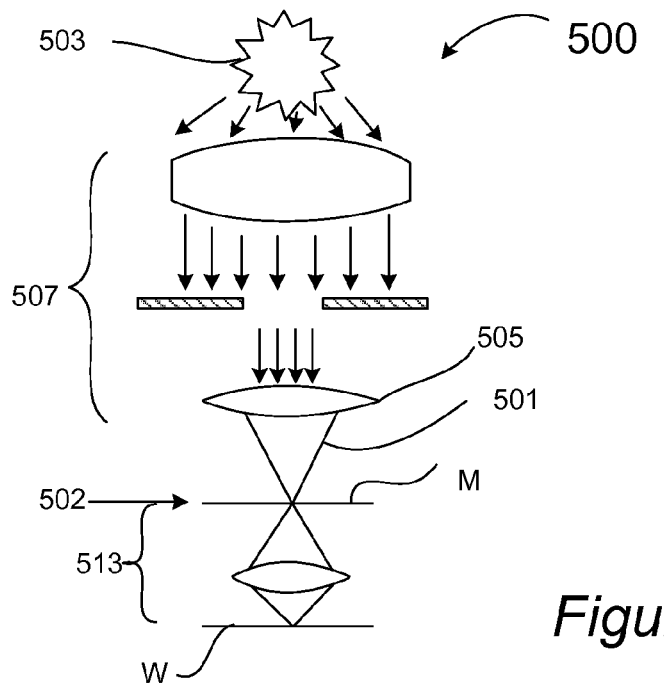
FIG. 5A is a simplified schematic representation of a lithographic system for transferring a mask pattern from a photomask onto a wafer in accordance with certain embodiments.

FIG. 5A is a simplified schematic representation of a typical lithographic system 500 that can be used to transfer a mask pattern from a photomask M onto a wafer W in accordance with certain embodiments. Examples of such systems include scanners and steppers, more specifically the TWINSCAN NXT:1970Ci Step-and-Scan system available from ASML in Veldhoven, Netherlands. In general, an illumination source 503 directs a light beam through an illumination optics 507 (e.g., lens 505) onto a photomask M located in a mask plane 502. Illumination lens 505 has a numeric aperture 501 at that plane 502. The value of the numerical aperture 501 impacts which defects on the photomask are lithographic significant defects and which ones are not. A portion of the beam that passes through the photomask M forms a patterned optical signal that is directed through imaging optics 513 and onto a wafer W to initiate the pattern transfer.

Figure 5B:
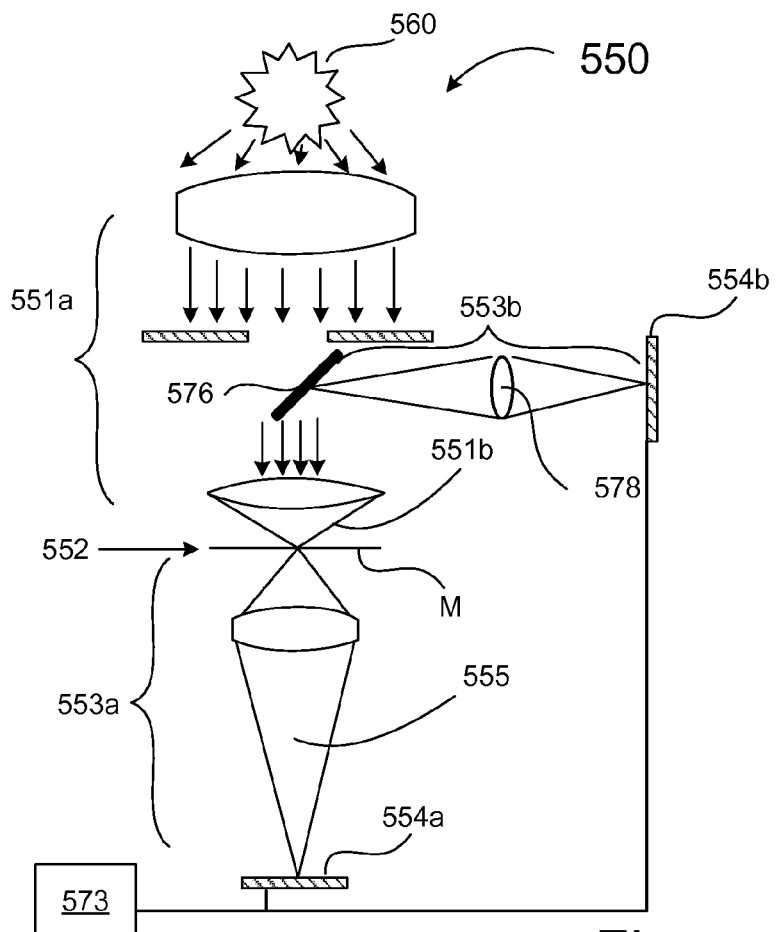
FIG. 5B provides a schematic representation of a photomask inspection apparatus in accordance with certain embodiments.

FIG. 5B provides a schematic representation of an example inspection system 550 that has illumination optics 551a includes an imaging lens with a relative large numerical aperture 551b at a reticle plane 552 in accordance with certain embodiments. The depicted inspection system 550 includes detection optics 553a and 553b, including microscopic magnification optics designed to provide, for example, 60-200× magnification or more for enhanced inspection. For example, numerical aperture 551b at the reticle plane 552 of the inspection system may be considerable greater than the numerical aperture 501 at the reticle plane 502 of the lithography system 500, which would result in differences between test inspection images and actual printed images.

The inspection techniques described herein may be implemented on various specially configured inspection systems, such as the one schematically illustrated in FIG. 5B. The illustrated system 550 includes an illumination source 560 producing a light beam that is directed through illumination optics 551a onto a photomask M in the reticle plane 552. Examples of light sources include a coherent laser light source (e.g., deep UV or gas laser generator), a filtered lamp, LED light source, etc. In one example, the source is a 193 nm laser. As explained above, the inspection system 550 may have a numerical aperture 551b at the reticle plane 552 that may be greater than a reticle plane numerical aperture (e.g., element 501 in FIG. 5A) of the corresponding lithography system. The photomask M to be inspected is placed on a mask stage at the reticle plane 552 and exposed to the source.

The patterned image from the mask M is directed through a collection of optical elements 553a, which project the patterned image onto a sensor 554a. In a reflecting system, optical elements (e.g., beam splitter 576 and detection lens 578) direct and capture the reflected light onto sensor 554b. Although two sensors are shown, a single sensor can be used to detect reflected and transmitted light during different scans of the same reticle area. Suitable sensors include charged coupled devices (CCD), CCD arrays, time delay integration (TDI) sensors, TDI sensor arrays, photomultiplier tubes (PMT), and other sensors.

The illumination optics column may be moved respect to the mask stage and/or the stage moved relative to a detector or camera by any suitable mechanism so as to scan patches of the reticle. For example, a motor mechanism may be utilized to move the stage. The motor mechanism may be formed from a screw drive and stepper motor, linear drive with feedback position, or band actuator and stepper motor, by way of examples.

The signals captured by each sensor (e.g., 554a and/or 554b) can be processed by a computer system 573 or, more generally, by one or more signal processing devices, which may each include an analog-to-digital converter configured to convert analog signals from each sensor into digital signals for processing. The computer system 573 typically has one or more processors coupled to input/output ports, and one or more memories via appropriate buses or other communication mechanisms.

The computer system 573 may also include one or more input devices (e.g., a keyboard, mouse, joystick) for providing user input, such as changing focus and other inspection recipe parameters. The computer system 573 may also be connected to the stage for controlling, for example, a sample position (e.g., focusing and scanning) and connected to other inspection system components for controlling other inspection parameters and configurations of such inspection system components.

The computer system 573 may be configured (e.g., with programming instructions) to provide a user interface (e.g., a computer screen) for displaying resultant intensity values, images, and other inspection results. The computer system 573 may be configured to analyze intensity, phase, and/or other characteristics of reflected and/or transmitted sensed light beam. The computer system 573 may be configured (e.g., with programming instructions) to provide a user interface (e.g., on a computer screen) for displaying resultant intensity values, images, and other inspection characteristics. In certain embodiments, the computer system 573 is configured to carry out inspection techniques detailed above Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

In certain embodiments, a system for inspecting a photomask includes at least one memory and at least one processor that are configured to perform techniques described herein. One example of an inspection system includes a specially configured TeraScan™ DUV inspection system available from KLA-Tencor of Milpitas, Calif.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method of qualifying a photolithographic reticle, the method comprising:
    using an optical reticle inspection tool, acquiring at least two images at different imaging configurations from each pattern area of the reticle;
    reconstructing a reticle pattern based on each at least two images from each pattern area of the reticle;
    for each reconstructed reticle pattern, modeling a lithographic process with two or more different process conditions on such reconstructed reticle pattern to generate two or more corresponding modeled test wafer patterns; and
    analyzing each two or more modelled test wafer patterns to identify hot spot patterns of the reticle patterns that are susceptible to the different process conditions altering wafer patterns formed with such hot spot patterns.

2. The method of claim 1, wherein the at least two images at different imaging conditions include a reflected and transmitted image.

3. The method of claim 1, wherein the at least two images at different imaging conditions include at least two reflected images with different pupil shapes and/or different focal conditions.

4. The method of claim 1, wherein the at least two images at different imaging conditions include information from which amplitude and phase of a pattern of the mask may be determined through mathematically iterative processes.

5. The method of claim 1, wherein the two or more different process conditions include two or more different exposure and focus settings.

6. The method of claim 5, wherein the two or more different exposure and focus settings include a plurality of exposure and focus settings from a focus exposure matrix (FEM).

7. The method of claim 5, wherein modeling includes modeling a photoresist material.

8. The method of claim 7, wherein modeling includes modeling an etching or chemical mechanical planarization (CMP) process.

9. The method of claim 1, wherein hot spot patterns are identified prior to commencement of high volume wafer fabrication with such reticle or prior to any wafer fabrication with such reticle.

10. The method of claim 1, further comprising:
simulating a plurality of reference reticle patterns based on a plurality of post-OPC (optical proximity correction) design patterns; and
performing the modelling operation on each reference reticle pattern so as to generate two or more corresponding modeled reference wafer patterns,
wherein analyzing includes comparing each modelled test wafer pattern to its corresponding reference wafer pattern and identifying a hot spot pattern for such modelled test pattern when a difference resulting from such comparison exceeds a predetermined threshold.

11. The method of claim 10, further comprising identifying a plurality of initial hot spot locations for the reference and test reticle patterns and generating modelled test and reference wafer patterns that correspond to only initial hot spot locations.

12. The method of claim 1, wherein each hot spot pattern is identified when its corresponding two or more modelled test wafer patterns vary by a predetermined amount for the different two or more process conditions.

13. The method of claim 1, wherein analyzing each two or more modelled test wafer patterns includes analyzing a plurality of corresponding post-OPC design patterns to separate effects of the two or more different process conditions on a design used to fabricate the reticle from effects of the two or more different process conditions on the reticle.

14. The method of claim 1, further comprising inspecting wafer patterns that are fabricated with such reticle corresponding to the identified hot spot patterns with a lower threshold than wafer patterns that do not correspond to identified hot spot patterns.

15. The method of claim 1, further comprising modifying a design pattern corresponding to an identified hot spot pattern and fabricating a new reticle based on such modified design pattern.

16. An inspection system for qualifying a photolithographic reticle, the system comprising:
a light source for generating an incident beam;
an illumination optics module for directing the incident beam onto a reticle;
a collection optics module for directing two or more output beams, at different imaging configuration in response to the incident beam, from each pattern area of the reticle to at least one sensor;
at least one sensor for detecting the two or more output beams and generating two or more images or signals for the two or more output beams; and
a controller that is configured to perform the following operations:
reconstructing a reticle pattern based on each at least two images from each pattern area of the reticle;
for each reconstructed reticle pattern, modeling a lithographic process with two or more different process conditions on such reconstructed reticle pattern to generate two or more corresponding modeled test wafer patterns; and
analyzing each two or more modelled test wafer patterns to identify hot spot patterns of the reticle patterns that are susceptible to the different process conditions altering wafer patterns formed with such hot spot patterns.

17. The system of claim 16, wherein the at least two images at different imaging conditions include a reflected and transmitted image.

18. The system of claim 16, wherein the at least two images at different imaging conditions include at least two reflected images with different pupil shapes and/or different focal conditions.

19. The system of claim 16, wherein the at least two images at different imaging conditions include information from which amplitude and phase of a pattern of the mask may be determined through mathematically iterative processes.

20. The system of claim 16, wherein the two or more different exposure and focus settings include a plurality of exposure and focus settings from a focus exposure matrix (FEM) and modeling includes modeling a photoresist material.

21. The system of claim 16, wherein hot spot patterns are identified prior to commencement of high volume wafer fabrication with such reticle or prior to any wafer fabrication with such reticle.

22. The system of claim 16, wherein the controller is further configured for:
simulating a plurality of reference reticle patterns based on a plurality of post-OPC (optical proximity correction) design patterns; and
performing the modelling operation on each reference reticle pattern so as to generate two or more corresponding modeled reference wafer patterns,
wherein analyzing includes comparing each modelled test wafer pattern to its corresponding reference wafer pattern and identifying a hot spot pattern for such modelled test pattern when a difference resulting from such comparison exceeds a predetermined threshold.

23. The system of claim 22, wherein the controller is further configured for identifying a plurality of initial hot spot locations for the reference and test reticle patterns and generating modelled test and reference wafer patterns that correspond to only initial hot spot locations.

24. The system of claim 16, wherein each hot spot pattern is identified when its corresponding two or more modelled test wafer patterns vary by a predetermined amount for the different two or more process conditions.

25. The system of claim 16, wherein analyzing each two or more modelled test wafer patterns includes analyzing a plurality of corresponding post-OPC design patterns to separate effects of the two or more different process conditions on a design used to fabricate the reticle from effects of the two or more different process conditions on the reticle.

* * * * *